(12) United States Patent
Albertinetti et al.

(10) Patent No.: US 11,887,921 B2
(45) Date of Patent: Jan. 30, 2024

(54) METHOD OF PRODUCING SEMICONDUCTOR DEVICES AND CORRESPONDING SEMICONDUCTOR DEVICE

(71) Applicants: STMicroelectronics S.r.l., Agrate Brianza (IT); STMicroelectronics SDN BHD, Muar (MY)

(72) Inventors: Andrea Albertinetti, Sizzano (IT); Marifi Corregidor Cagud, Johor (MY)

(73) Assignees: STMicroelectronics S.r.l., Agrate Brianza (IT); STMicroelectronics SDN BHD, Muar (MY)

( * ) Notice: Subject to any disclaimer, the term of this patent is extended or adjusted under 35 U.S.C. 154(b) by 2 days.

(21) Appl. No.: 17/412,007

(22) Filed: Aug. 25, 2021

(65) Prior Publication Data
US 2022/0068788 A1    Mar. 3, 2022

(30) Foreign Application Priority Data
Aug. 28, 2020    (IT) .......................... 102020000020605

(51) Int. Cl.
*H01L 23/498*    (2006.01)
*H01L 23/00*    (2006.01)

(52) U.S. Cl.
CPC ........ *H01L 23/49838* (2013.01); *H01L 24/27* (2013.01); *H01L 24/29* (2013.01);
(Continued)

(58) Field of Classification Search
CPC ........................... H01L 2224/26–33519; H01L 2224/32221–3226;
(Continued)

(56) References Cited

U.S. PATENT DOCUMENTS

2008/0233680 A1* 9/2008 Okamoto ................ H01L 24/29
414/217
2013/0215583 A1* 8/2013 Vincent ................. H01L 23/315
29/841
(Continued)

FOREIGN PATENT DOCUMENTS

| EP | 3489991 A1 | 5/2019 |
| JP | S54019685 A | 2/1979 |
| JP | 2008205326 A | 9/2008 |

OTHER PUBLICATIONS

IT Search Report and Written Opinion for IT Appl. No. 102020000020605 dated May 3, 2021 (16 pages).
(Continued)

*Primary Examiner* — Julio J Maldonado
*Assistant Examiner* — Stanetta D Isaac
(74) *Attorney, Agent, or Firm* — Crowe & Dunlevy

(57) ABSTRACT

A warped semiconductor die is attached onto a substrate such as a leadframe by dispensing a first mass of die attach material onto an area of the substrate followed by dispensing a second mass of die attach material so that the second mass of die attach material provides a raised formation of die attach material. For instance, the second mass may be deposited centrally of the first mass. The semiconductor die is placed onto the first and second mass of die attach material with its concave/convex shape matching the distribution of the die attach material thus effectively countering undesired entrapment of air.

21 Claims, 1 Drawing Sheet

(52) U.S. Cl.
CPC ...... *H01L 24/83* (2013.01); *H01L 2224/2732* (2013.01); *H01L 2224/29019* (2013.01); *H01L 2224/83192* (2013.01)

(58) Field of Classification Search
CPC .................. H01L 2224/291–29184; H01L 2224/2919–29191; H01L 2224/8385–83885; H01L 2224/83855–8388; H01L 2224/2901–29036
See application file for complete search history.

(56) References Cited

U.S. PATENT DOCUMENTS

2014/0339709 A1* 11/2014 Ren .................. H01L 21/563
 438/118
2018/0040530 A1 2/2018 Mahler et al.

OTHER PUBLICATIONS

Fu S et al: "A Multichip Phase-Leg IGBT Module Bonded by Pressureless Sintering of Nanosilver Paste", IEEE Transactions On Device and Materials Reliability, IEEE Service Center, Piscataway, NJ, US, vol. 17, No. 1, Mar. 6, 2017.

* cited by examiner

METHOD OF PRODUCING SEMICONDUCTOR DEVICES AND CORRESPONDING SEMICONDUCTOR DEVICE

PRIORITY CLAIM

This application claims the priority benefit of Italian Application for Patent No. 102020000020605, filed on Aug. 28, 2020, the content of which is hereby incorporated by reference in its entirety to the maximum extent allowable by law.

TECHNICAL FIELD

The description relates to semiconductor devices.

One or more embodiments may advantageously apply to manufacturing semiconductor devices comprising components such as semiconductor chips or dice exposed to warping.

BACKGROUND

Certain electronic components such as "power" integrated circuit die benefit from having a reduced die thickness (that is, from being very thin). Such a reduced thickness increases thermal draining and may also decrease the conduction or "on" resistance, Ron in vertical transistor devices.

Metallization of the front (top) side of the component, as involved in processing steps such as ribbon wedge bonding, may result in appreciable die warpage. Such warpage militates against satisfactory die attachment on a substrate such as a leadframe, for instance.

Stencil printing of die attach material is currently used for thin integrated circuit die as this facilitates avoiding edge bleeding on top of the die.

Die warpage may result in an undesirable entrapment of air under the die in the die attach glue, which may in turn cause undesired phenomena such as delamination during ribbon wedge bonding, with ensuing performance and reliability issues.

There is a need in the art to contribute in overcoming the drawbacks outlined in the foregoing.

SUMMARY

One or more embodiments may relate to a method.

One or more embodiments may relate to a related device. An integrated circuit mounted on a substrate such as a leadframe may be exemplary of such a substrate.

One or more embodiments may envisage a dual-dispense process, comprising glue stencil printing followed by glue nozzle writing (in a cross-like pattern or the like, for instance). Such a dual-dispense process effectively counters air entrapping, which results in improved performance and reliability, such as an increased wedge bonding yield, for instance.

One or more embodiments may be applied to packages such as QFN (Quad-Flat No Leads) packages, for instance, and in general to semiconductor devices exposed to warped die issues.

One or more embodiments may contemplate using different glue rheology/thixotropy in different dispensing steps which may result in a higher density of filler particles (Ag balls, for instance) in the attach glue at the center in comparison with the periphery of the die/device.

One or more embodiments may offer advantages such as: improved die attach quality; increased wire/wedge/ribbon bonding yield; and improved reliability.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Figure 1:
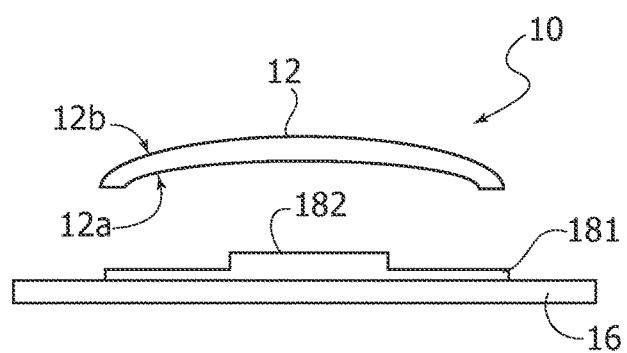
FIG. 1 is a partially exploded, cross-sectional view of a semiconductor device exemplary of a way of carrying out a method according to the present disclosure.

One or more embodiments as exemplified herein deal with semiconductor products such as the one designated 10 in FIG. 1 which include a component 12 exposed to warping.

Products involving one or more semiconductor chips or dice 12 that become warped after dicing, such as thin (for instance, with a thickness of about 110 microns) and large (for instance, with an area of about 34 mm²) dice, are exemplary of products to which embodiments can be advantageously applied. Of course, these quantitative figures are merely exemplary and non-limiting.

A product (device) 10 may include a QFN (Quad Flat No-Leads) package 14, that is, a package 14 that has leads incorporated in the bottom side of molding compound. This package is not visible in FIG. 1 for ease of representation.

Stencil printing is a conventional process in the art which involves depositing a die attach material on a substrate 16 (such as a so-called die pad in a leadframe) to establish a mechanical/electrical and thermally-conductive coupling between the substrate and the component/die.

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the chip or die to other electrical components or contacts.

Stencil printing as practiced conventionally is then (for example, immediately) followed by a step or stage of placing the component/die 12 onto the substrate 16. Equipment and materials used in this stage include a (dedicated) stencil, die attach material, and a printer.

Writing (via a writing head with a dispensing nozzle) is another process which may be applied in depositing the die attach material on a substrate to establish the mechanical/electrical and thermally-conductive coupling between the substrate and a component/die.

Writing can be then (for example, immediately) followed by a step or stage of placing the component/die 12 onto the substrate 16. Equipment and materials used in this stage may include a (round) dispensing head, oftentimes referred to as a "capillary", and a time-pressure pump as currently available in standard die bonding equipment. A time-pressure pump applies timed pressure pulses to a dispensing syringe, with dispensing parameters monitored by system software and a pressure controller.

Stencil printing has been the prevailing solution insofar as it provides a robust die attach process with thin dice and flat leadframes/substrates.

Those of skill in the art will appreciate that manufacturing semiconductor devices such as the device 10 also involves various additional steps or acts (for instance, forming a wire bonding pattern providing electrical connections between the chip or die 12 and electrically conductive leads in the substrate 16, molding the package 14 onto the resulting assembly, and so on). These—otherwise conventional—steps or acts are not discussed here in order to avoid making this description unnecessarily cumbersome.

It is observed that thin and large components/dice, that is components/dice having a reduced aspect ratio, are exposed (as a result of metallization, for instance) to warpage resulting in a warped shape that is currently conventionally referred to as "crying" shape. As represented—with deliberate exaggeration for ease of explanation—in FIG. 1, this is a curved shape which resembles the shape of a crying mouth exhibiting a downward facing concavity 12a (towards the substrate 16) and an upward facing convexity 12b (away from the substrate 16).

Such a "crying" shape (whose orientation—concave down/convex up—tends to repeat in a systematic way due to the phenomena underlying warpage) entails a risk of voids being formed in the die attach material between the die 12 and the substrate 16 when the die 12 is (gently) released on top of the attach material (glue layer).

Such voids have been found to have a severe impact on wire/wedge/ribbon bonding yield and, more generally, on performance of the final product or device (vertical current transfer and RdsOn in the case of field-effect transistors, for instance).

This inevitably limits application of stencil printing to thin dice that are relatively small, that is, dice having an aspect ratio close to 1 (also depending on the silicon technology involved).

To summarize: conventional glue dispensing followed by component placing shows intrinsic weaknesses when warped dice with a marked "crying" shape (see 12a, 12b in FIG. 1) are used; and this has a significant impact on wire/wedge/ribbon bonding yield and on product performance.

Figure 2:
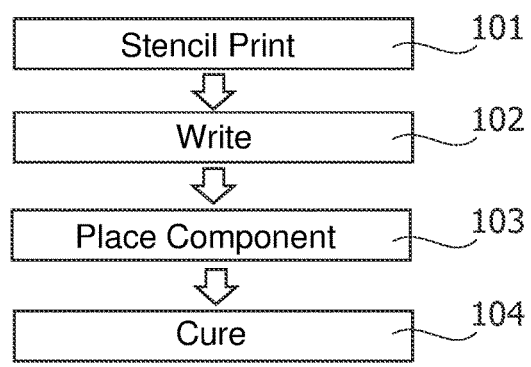
FIG. 2 is a flow chart exemplary of possible steps or acts in a method according to the present disclosure.

One or more embodiments as exemplified in FIGS. 1 and 2 address these issues via a process where: a first mass 181 of attach material (briefly, glue) is applied on the substrate 16 by glue (stencil) printing as exemplified at step 101; and a second mass 182 of glue is applied on the first mass 181 by glue writing (via a writing head having a nozzle) as exemplified at step 102.

Placing the component 12 onto the glue 181, 182 can then follow as exemplified at step 103, possibly followed by glue curing as is conventional in the art and exemplified at step 104.

As appreciable in FIG. 1, the second mass 182 of glue being applied centrally of the first mass 181 facilitates creating a central raised (in relief) glue formation with a resulting convex (almost dome-shaped) glue pattern (mass 181 plus mass 182) which tends to match the opposed—here, downward—concavity 12a of the warped "crying" profile of the die 12.

This was found to result in a more robust component placing process with reduced void presence in the die attach layer comprised of the masses 181, 182.

In turn, this was found to result in higher wire/wedge/ribbon bonding yields and better product performance.

A same die attach material can be used for the masses 181, 182.

Die attach materials such as conductive and non-conductive glues and sintering pastes as largely conventional in the art can be used for that purpose.

It is noted that these materials (and related machinery) may be already be present in the same process flow, as they are used for component pick and place steps, for instance.

A same die attach material used for both masses 181, 182 was found to be advantageous in facilitating die attach layer uniformity and reliability.

The different techniques involved (printing and writing) may otherwise involve different rheology characteristics in terms of viscosity and thixotropic index for instance. Rheology can be modified in a manner known per se to those of skill in the art by tuning the amount of solvent in the glue formulation.

For instance a formulation for the (stencil) printed mass 181 may exhibit a viscosity (E-type 3° corn, 5 rpm@RT) of about 40+/−5 Pa·s and a thixotropic index (0.5 rpm/5 rpm) of about 8.

A higher boiling temperature solvent may be used for longer floor life.

A formulation for the written mass 182 may exhibit a viscosity (E-type 3° corn, 5 rpm@RT) of about 20+/−3 Pa·s and a thixotropic index (0.5 rpm/5 rpm) of about 7-8.

Figure 3:
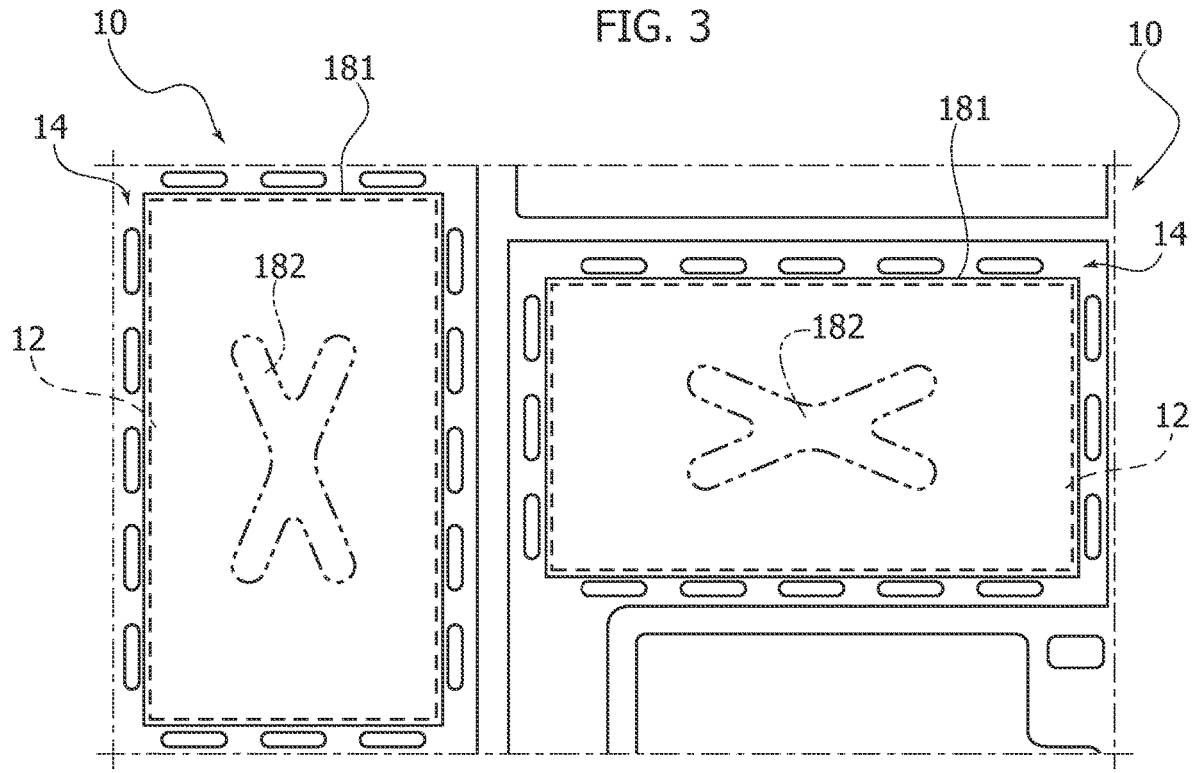
FIG. 3 is a see-through plan view of an electronic device produced with a method according to the present disclosure.

FIG. 3 is a plan view of two electronic devices 10 arranged side-by-side produced according to the present disclosure.

In FIG. 3, the package material 14 is represented as virtually light-permeable, thus facilitating a see-through view of the masses 181, 182 of die attach material under the die 12 as in the case of an X-ray photography of the device 10.

FIG. 3 is exemplary of the possibility of dispensing (writing) the second mass 182 of die attach material according to a cross-like pattern. This pattern was found to be particularly effective in facilitating homogeneous distribution of the die attach material in countering the undesired entrapment of air.

While embodiments as exemplified herein refer to dice 12 with a "crying" warped shape (concave down, convex up: see 12a and 12b in FIG. 1), one or more embodiments may apply to dice 12 with a "smiling" warped shape (convex 12b down instead of up, concave 12a up instead of down).

In that case, rather than centrally dispensing the first mass 181 (as exemplified herein), the second mass of attach material 182 can instead be dispensed (written) peripherally of the first mass 181. This facilitates creating a peripheral raised (in relief) glue formation with a resulting concave (basin-shaped) glue pattern (mass 181 plus mass 182) which tends to match an opposed convexity of the warped "smiling" profile of the die 12.

A method as exemplified herein may comprise: attaching a semiconductor die (for instance, 12) onto an area of a substrate (for instance, 16), wherein the semiconductor die comprises a warped semiconductor die having mutually opposed first and second surfaces, the first surface concave (for instance, 12a) and the second surface convex (for instance, 12b); dispensing (for instance, 101) a first mass (for instance, 181) of die attach material onto said substrate area; and dispensing (for instance, 102) a second mass (for instance, 182) of die attach material onto the first mass of die attach material dispensed onto said substrate area wherein the second mass of die attach material provides a raised (in relief) formation of die attach material; wherein the second mass of die attach material is dispensed centrally of the first mass of die attach material; and placing the semiconductor die onto the first and second mass of die attach material with the first concave surface (for instance, 12a) of the warped semiconductor die facing (that is, oriented towards) the substrate having the die attach material dispensed thereon.

As an alternative, the method may comprise dispensing the second mass of die attach material peripherally of the first mass of die attach material and placing the semiconductor die onto the first and second mass of die attach material with the second convex surface (for instance, 12b) of the warped semiconductor die facing (that is, oriented towards) the substrate (16) having the die attach material dispensed thereon.

A method as exemplified may comprise dispensing the second mass of die attach material according to a cross-like pattern (see FIG. 3, for instance).

In a method as exemplified herein, dispensing the first mass of die attach material may comprise stencil printing the first mass of die attach material onto said substrate area.

In a method as exemplified herein, dispensing the second mass of die attach material may comprise writing (with a writing head comprising a nozzle, for instance) the second mass of die attach material onto the first mass of die attach material.

In a method as exemplified herein, the first mass of die attach material and the second mass of die attach material may comprise a same die attach material.

A method as exemplified herein may comprise: dispensing the first mass of die attach material with a first viscosity value and a first thixotropic index; dispensing the second mass of die attach material with a second viscosity value and a second thixotropic index; wherein: said first viscosity value may be different from said second viscosity value, and/or said first thixotropic index may be different from said second thixotropic index.

A method as exemplified herein may comprise curing (for instance, 104) the first mass of die attach material and the second mass of die attach material dispensed onto said substrate having the semiconductor die placed thereon.

A device (for instance, 10) as exemplified herein may comprise: a semiconductor die (for instance, 12) attached onto an area of a substrate (for instance, 16) with die attach material (for instance, 181, 182), wherein the semiconductor die comprises a warped semiconductor die having mutually opposed first and second surfaces, the first surface concave (for instance, 12a) and the second surface convex (for instance, 12b); wherein the die attach material comprises a first mass (for instance, 181) of die attach material applied onto said substrate area and a second mass (for instance, 182) of die attach material applied onto the first mass of die attach material wherein the second mass of die attach material provides a raised formation of die attach material; and wherein the second mass of die attach material may be applied centrally of the first mass of die attach material and the semiconductor die may be placed onto the first and second mass of die attach material with the first concave surface (for instance, 12a) of the warped semiconductor die facing (that is, oriented towards) the substrate having the die attach material applied thereon.

Alternatively, the second mass of die attach material may be applied peripherally of the first mass of die attach material and the semiconductor die may be placed onto the first and second mass of die attach material with the second convex surface (for instance, 12b) of the warped semiconductor die facing (that is, oriented towards) the substrate having the die attach material applied thereon.

In a device as exemplified herein, said raised formation of die attach material may comprise a cross-like raised formation of die attach material (see FIG. 3, for instance).

In a device as exemplified herein, the raised formation of the second mass of die attach material (namely 182) may be thicker than the first mass of die attach material (namely 181).

It is noted that the thickness of the die attach material may be dictated primarily by the dispensing process rather than by its viscosity.

When writing is used (for the "raised" mass 182, for instance), the thickness of the dispensed material can be up to hundreds of micrometers, while in the case of stencil printing (for the mass 181, for instance) the thickness of the dispensed material can be some tens of micrometers.

In a device as exemplified herein, said first mass of die attach material and said second mass of die attach material may comprise a filler (silver (Ag) spheres or balls, for instance), with a difference between the filler contents of the two formulations (181 and 182, respectively).

These differences, together with the different thickness of the materials, facilitate revealing that the two-step process of the embodiments has been used, via X-ray detection, for instance. In fact, X-rays are sensitive to heavy metals (as is the case of silver fillers) and to the thickness of materials.

Without prejudice to the underlying principles, the details and embodiments may vary, even significantly, with respect to what has been described by way of example only without departing from the extent of protection.

The claims are an integral part of the technical teaching provided herein in respect of the embodiments.

The extent of protection is determined by the annexed claims.

The invention claimed is:

1. A method, comprising:
  attaching a semiconductor die onto an area of a substrate, wherein the semiconductor die comprises a warped semiconductor die having mutually opposed first and second surfaces, the first surface concave and the second surface convex;
  wherein attaching comprises:
    dispensing a first mass of die attach material having a first rheology onto said area;
    dispensing a second mass of die attach material having a second rheology different from the first rheology onto the first mass of die attach material;
    wherein the second mass of die attach material provides a raised formation of die attach material relative to the first mass of die attach material;

wherein dispensing the second mass of die attach material comprises dispensing the second mass of die attach material centrally of the first mass of die attach material; and placing the warped semiconductor die onto the first and second mass of die attach material with the first concave surface of the warped semiconductor die facing the substrate having the die attach material dispensed thereon.

2. The method of claim 1, wherein dispensing the second mass of die attach material further comprises dispensing the second mass of die attach material according to a cross-like pattern.

3. The method of claim 1, wherein dispensing the first mass of die attach material comprises stencil printing the first mass of die attach material onto said area.

4. The method of claim 3, wherein dispensing the second mass of die attach material comprises writing the second mass of die attach material onto the first mass of die attach material.

5. The method of claim 1, wherein the first mass of die attach material and the second mass of die attach material comprise a same die attach material.

6. The method of claim 1, wherein the first rheology of the first mass of die attach material is defined by a first viscosity value and a first thixotropic index, and wherein the second rheology of the second mass of die attach material is defined by a second viscosity value and a second thixotropic index.

7. The method of claim 6, wherein said first viscosity value is different from said second viscosity value.

8. The method of claim 6, wherein said first thixotropic index is different from said second thixotropic index.

9. The method of claim 1, further comprising curing the first mass of die attach material and the second mass of die attach material so as to attach the warped semiconductor die to the substrate.

10. The method of claim 1, wherein said first mass of die attach material and said second mass of die attach material comprise a filler.

11. The method of claim 10, wherein the first mass of die attach material comprises an amount of filler different from an amount of filler in the second mass of die attach material.

12. A method, comprising:
attaching a semiconductor die onto an area of a substrate, wherein the semiconductor die comprises a warped semiconductor die having mutually opposed first and second surfaces, the first surface concave and the second surface convex;
wherein attaching comprises:
dispensing a first mass of die attach material having a first rheology onto said area;
dispensing a second mass of die attach material having a second rheology different from the first rheology onto the first mass of die attach material;
wherein the second mass of die attach material provides a raised formation of die attach material relative to the first mass of die attach material;
wherein dispensing the second mass of die attach material comprises dispensing the second mass of die attach material peripherally of the first mass of die attach material; and
placing the warped semiconductor die onto the first and second mass of die attach material with the second convex surface of the warped semiconductor die facing the substrate having the die attach material dispensed thereon.

13. The method of claim 12, wherein dispensing the first mass of die attach material comprises stencil printing the first mass of die attach material onto said area.

14. The method of claim 13, wherein dispensing the second mass of die attach material comprises writing the second mass of die attach material onto the first mass of die attach material.

15. The method of claim 12, wherein the first mass of die attach material and the second mass of die attach material comprise a same die attach material.

16. The method of claim 12, wherein the first rheology of the first mass of die attach material is defined by a first viscosity value and a first thixotropic index, and wherein the second rheology of the second mass of die attach material is defined by a second viscosity value and a second thixotropic index.

17. The method of claim 16, wherein said first viscosity value is different from said second viscosity value.

18. The method of claim 16, wherein said first thixotropic index is different from said second thixotropic index.

19. The method of claim 12, further comprising curing the first mass of die attach material and the second mass of die attach material so as to attach the warped semiconductor die to the substrate.

20. The method of claim 12, wherein said first mass of die attach material and said second mass of die attach material comprise a filler.

21. The method of claim 20, wherein the first mass of die attach material comprises an amount of filler different from an amount of filler in the second mass of die attach material.

* * * * *